United States Patent
Vemula

(10) Patent No.: US 9,570,941 B2
(45) Date of Patent: Feb. 14, 2017

(54) AUTONOMOUS POWER SUPPLY

(71) Applicant: NXP B.V., Eindhoven (NL)

(72) Inventor: Madan Vemula, Tempe, AZ (US)

(73) Assignee: NXP B.V., Eindhoven (NL)

( * ) Notice: Subject to any disclaimer, the term of this patent is extended or adjusted under 35 U.S.C. 154(b) by 166 days.

(21) Appl. No.: 14/530,189

(22) Filed: Oct. 31, 2014

(65) Prior Publication Data

US 2016/0126784 A1    May 5, 2016

(51) Int. Cl.
| | |
|---|---|
| *H02J 9/06* | (2006.01) |
| *H02M 3/07* | (2006.01) |
| *H02M 7/217* | (2006.01) |
| *H02M 7/538* | (2007.01) |
| *H03L 7/089* | (2006.01) |
| *G11C 5/14* | (2006.01) |
| *G11C 16/30* | (2006.01) |

(52) U.S. Cl.
CPC ............. *H02J 9/061* (2013.01); *H02M 3/07* (2013.01); *G11C 5/145* (2013.01); *G11C 16/30* (2013.01); *H02M 3/073* (2013.01); *H02M 7/217* (2013.01); *H02M 7/538* (2013.01); *H03L 7/0895* (2013.01)

(58) Field of Classification Search
CPC ........ H02M 3/07; H02M 3/073; H02M 3/217; H02M 7/538; H03L 7/0895; G11C 5/145; G11C 16/30
See application file for complete search history.

(56) References Cited

U.S. PATENT DOCUMENTS

| | | | |
|---|---|---|---|
| 4,617,473 A * | 10/1986 | Bingham | ............... H02J 9/061 307/66 |
| 4,812,672 A | 3/1989 | Cowan et al. | |
| 5,598,041 A * | 1/1997 | Willis | ................... H02J 1/108 307/43 |
| 8,044,639 B2 | 10/2011 | Tamegai et al. | |

(Continued)

FOREIGN PATENT DOCUMENTS

| | | |
|---|---|---|
| DE | 102004035126 A1 | 2/2006 |
| JP | 63-290159 A | 11/1988 |

(Continued)

OTHER PUBLICATIONS

Extended European Search Report for Patent Appln. No. 15186263.8 (May 16, 2016).

*Primary Examiner* — Jaweed A Abbaszadeh
*Assistant Examiner* — Terrell Johnson
(74) *Attorney, Agent, or Firm* — Rajeev Madnawat

(57) ABSTRACT

Aspects of the present disclosure are directed to providing power from two or more power sources. As may be implemented in accordance with one or more embodiments, a switching circuit includes a switching transistor connected between a backup power supply and both a primary power supply and an internal power rail. When power is provided via the primary power supply, the switching circuit operates in a blocking state in which back current is prevented from flowing to the backup power supply while the primary power supply couples power to the internal power rail. When the primary power supply is disconnected or interrupted, a voltage coupled to a gate/control terminal of the switching circuit drops and the switching circuit automatically switches to another state in which the internal power rail is powered by the backup power supply.

18 Claims, 8 Drawing Sheets

(56) References Cited

U.S. PATENT DOCUMENTS

| | | | |
|---|---|---|---|
| 2007/0182362 A1* | 8/2007 | Trainor | H01M 10/46 320/101 |
| 2008/0174277 A1 | 7/2008 | Ueno | |
| 2008/0204958 A1* | 8/2008 | Shearon | H02H 3/18 361/93.9 |
| 2010/0250974 A1 | 9/2010 | Ristic et al. | |
| 2010/0301673 A1 | 12/2010 | Riedel et al. | |
| 2011/0310689 A1* | 12/2011 | Hayden | G11C 5/147 365/226 |
| 2014/0001861 A1* | 1/2014 | Mann | G06F 1/30 307/66 |

FOREIGN PATENT DOCUMENTS

| | | |
|---|---|---|
| JP | 08-335866 A | 12/1996 |
| JP | 09-308102 A | 11/1997 |
| JP | 2008-182822 A | 8/2008 |
| JP | 2009-106058 A | 5/2009 |
| JP | 2013-158167 A | 8/2013 |
| WO | 97/18612 A1 | 5/1997 |

* cited by examiner

AUTONOMOUS POWER SUPPLY

Aspects of various embodiments are directed to autonomously selecting respective power sources.

Many circuits and devices are operable using two or more different power sources. These sources may, for example, be provided on different supply rails and may be provided internally, externally or both. For instance, many devices such as portable computers have an internal battery and are also operable via an external power supply.

Various circuits have a power supply rail that provides power derived from two or more external power supplies. These external power supplies may be connected and disconnected or otherwise turned on and off, which can present challenges to providing power on an internal power supply rail. For example, generating an internal power supply without any voltage dips when respective external supplies turn on and off can be challenging. In addition, back current and voltage dips can occur on an internal power supply when an external power supply is disconnected or goes to 0V. If the internal power supply voltage undergoes a large voltage drop, this may cause the circuit being powered to go through the power cycle, which can adversely affect the operation of the circuit. For example, when both a battery and an AC/DC adaptor are connected to a laptop computer, removing the AC/DC adaptor or battery may undesirably cause the laptop computer to reboot.

These and other matters have presented challenges to providing power from different sources, for a variety of applications.

Various example embodiments are directed to power circuits and their implementation.

According to an example embodiment, an apparatus includes an internal power rail that provides power to circuits in the apparatus, and a switching circuit including a switching transistor. The switching transistor has a first source/drain region connected to a primary power supply circuit and to the internal power rail, and a second source/drain region connected to a backup power supply circuit. A control terminal of the switching transistor is coupled to the primary power supply circuit. The switching transistor operates with the primary power supply circuit and with the backup power supply circuit as follows. In response to power provided via the primary power supply circuit, the switching transistor automatically switches to a blocking state in which back current is prevented from flowing from the primary power supply circuit to the backup power supply circuit, while the primary power supply circuit couples power to the internal power rail. The switching circuit is further responsive to a voltage coupled to the control terminal via the primary power supply circuit and to a voltage on the primary power supply being smaller than a voltage on the backup power supply circuit, by automatically switching to another state in which the internal power rail is connected for providing power from the backup power supply circuit to the internal power rail.

Another embodiment is directed to an apparatus including an input power bus that provides input power from an external power supply, an internal power rail that provides power to circuits in the apparatus, and at least two power supplies including an external power supply and a battery power supply. The external power supply includes a first input port connected to the input power bus and a first transistor circuit having a first gate, the first transistor circuit selectively couples power from the first input port to the internal power rail based on a voltage applied to the first gate. The battery power supply includes a second input port and a second transistor circuit having a second gate, with the second transistor circuit coupling power from a battery coupled to the second input port based on a voltage applied to the second gate. The apparatus further includes a switching circuit having a diode that blocks current from flowing from the external power supply circuit to the battery power supply circuit, and a third transistor circuit having a third gate and respective source/drain regions. A first one of the source/drain regions is connected to the external power supply and to the internal power rail, and a second one of the source/drain regions is connected to the second transistor circuit. The third transistor circuit couples power from the battery to the internal power rail, via the second transistor, based on a voltage applied to the third gate. A charge pump applies a voltage respectively to the first and third gates using power provided on the input power bus, and operates with the first and third transistor circuits to selectively power the internal power rail with the input power bus and the battery as follows. In response to power being provided on the input power bus, the charge pump operates the first transistor circuit in a passing state and operates the third transistor circuit in a blocking state, in which the first transistor provides power to the internal power rail from the input power bus while the diode prevents back current from flowing from the input power bus to the battery power supply circuit. In response to power on the input power bus dropping below a threshold, the charge pump operates the first transistor circuit in a blocking state and operates the third transistor circuit in a passing state in which the third transistor circuit provides power from the battery, via the second transistor circuit, to the internal power rail.

Another embodiment is directed to a method for use with an internal power rail that provides power to circuits in an apparatus. A switching circuit including a switching transistor having a first source/drain region connected to a primary power supply circuit and to the internal power rail, having a second source/drain region connected to a backup power supply circuit, and having a control terminal coupled to the primary power supply circuit, is used as follows. In response to power provided via the primary power supply circuit, a blocking state is automatically switched to, in which back current is prevented from flowing from the primary power supply circuit to the backup power supply circuit while the primary power supply circuit couples power to the internal power rail. In response to a voltage coupled to the control terminal via the primary power supply circuit and to a voltage on the primary power supply being smaller than a voltage on the backup power supply circuit, another state is automatically switched to, in which the internal power rail is connected for providing power from the backup power supply circuit to the internal power rail.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
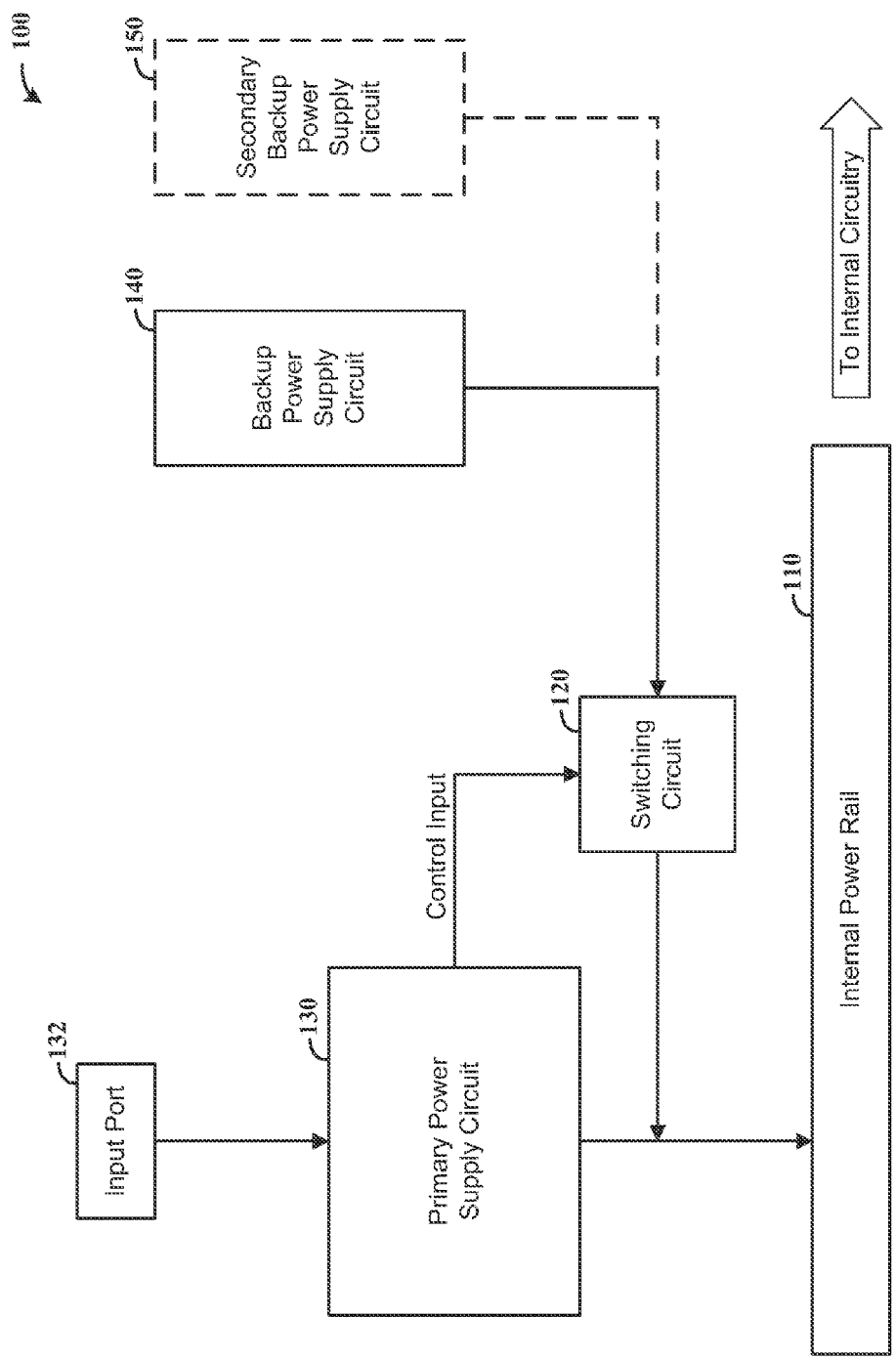
FIG. 1 shows an apparatus for providing autonomous power supply coupling, in accordance with an example embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving power supply selection. While not necessarily so limited, various aspects may be appreciated through a discussion of examples using this context.

Various example embodiments are directed to autonomously selecting from two or more available power supplies, such as between an input (e.g., line) power supply and backup/battery power supply. An autonomous switching circuit operates based on power provided on a first/primary supply, by automatically switching from the first/primary supply to a second/backup supply. Correspondingly, the switching circuit also operates to automatically switch the second/backup supply off when the first/primary supply is available.

In various contexts, backflow of current is mitigated or prevented into either power supply, when another power supply is being used. Such embodiments may, for example, be implemented on an integrated circuit chip having an internal supply rail that is derived from an external power supply or backup battery (or other supply). The autonomous switching can be implemented while mitigating voltage dips.

In a more particular embodiment, the switching circuit includes an input switch that couples an internal power rail to an input port that provides power to the first/primary supply, and a backup switch that couples the power rail to the backup/battery supply based on voltage (or lack thereof) provided on the input port. The switches are controlled autonomously. When a voltage at the input port is removed or drops below a threshold, the input switch circuit disconnects the input port and the backup switch connects the backup/battery supply to the internal power rail. When the voltage at the input port comes back up (e.g., upon connection to an external power supply), the input switch circuit is operated to reconnect the input port while the backup switch disconnects the backup/battery supply.

In some implementations, the switching operation is carried out by a charge pump that operates based on power provided at the input port, with the charge pump providing a control input to gates of transistors that carry out each switching function. The circuits are operable such that the single charge pump operates to turn the respective transistors on and off in each state (i.e., so that one transistor is transitioned to an OFF state when another transistor is transitioned to the ON state). In some embodiments, different types (n/p) of transistors are used, with the n-type transistor operating in an ON state and the p-type transistor operating in the OFF state when a voltage is applied to both gates, and with the n-type transistor operating in the OFF state and the p-type transistor operating in the ON state when the voltage drops or is removed.

Using these and other approaches as described herein, power supplies for mobile devices, personal computers, tablets and other electronics can be implemented to facilitate seamless power switching between power supplies, such as between an external supply and internal battery supply. Further, such approaches can be implemented to address issues that may occur due to power fluctuations, such as by reducing or eliminating power on reset issues when one of the power sources is removed. These approaches also operate to ensure that power supplies do not power each other, such as by ensuring that back current does not flow from an active supply to an inactive supply during transitions and/or when one supply is at a voltage level that is lower than another one of the supplies.

According to another example embodiment, a switching circuit includes a switching transistor (e.g., PMOS) having a source/drain region connected to a primary power supply and to an internal power rail, and a second source/drain region connected to a backup power supply. A control terminal of the switching transistor is coupled to the primary power supply such that the switching transistor operates with the primary power supply and with the backup power supply as follows. When the primary power supply is active, the switching transistor operates in a blocking state in which back current is prevented from flowing from the primary power supply to the backup power supply while the primary power supply couples power to the internal power rail (e.g., by operating in an OFF state and/or implementing a diode). The switching circuit is further responsive to a voltage coupled to the control terminal via the primary power supply and to a voltage on the primary power supply being smaller than a voltage on the backup power supply, by automatically switching to another state in which the internal power rail is connected for providing power from the backup power supply to the internal power rail. This other state may be incurred when voltage on the primary power supply drops below a threshold or is removed.

In some embodiments, a charge pump operates the switching transistor using power provided by the primary power supply. The switching transistor is operated in an OFF state by applying the voltage to the control terminal in the blocking state. The charge pump may further cease applying the voltage to the control terminal in response to power dropping on the primary power supply circuit, in response to which the switching transistor automatically switches to an ON state via the charge pump ceasing to apply the voltage (e.g., by applying a lesser voltage or no voltage).

In some implementations, the primary power supply includes an input port at which power is provided to the primary power supply circuit, and a second transistor having a gate coupled to an output voltage of the charge pump and to a source and drain connected between the input port and a node directly connected to both the power rail and the first source/drain region of the switching transistor. The charge pump couples power from the input port to the internal power rail using the power provided by the primary power supply circuit to operate the second transistor in an ON state while operating the switching transistor in the OFF state.

In some embodiments, the switching transistor is a PMOS transistor and the second transistor is an NMOS transistor. The PMOS transistor operates in the OFF state in response to a voltage level provided to a gate of the PMOS transistor by the charge pump, and in the ON state in response to the charge pump ceasing to provide the voltage level to the gate of the PMOS transistor. The NMOS transistor operates in the ON state in response to a voltage level provided to a gate of the NMOS transistor by the charge pump and to operate in the OFF state in response to the charge pump ceasing to provide the voltage level to the gate of the NMOS transistor. In some implementations, the primary power supply includes a resistor circuit coupled to the second transistor and to the charge pump, and mitigates back current flow from the internal power rail to the input port by discharging voltage from the gate of the second transistor in response to power provided on the input port transitioning toward 0V. In other implementations, the primary power supply includes a capacitor circuit coupled to the second transistor and to the charge pump in parallel with the resistor circuit, and reduces the coupling of voltage fluctuations from the input port to the gate of the second transistor. In still other implementations, the resistor and capacitor are both used and connected in parallel.

The power may be provided for the switching transistor control from the primary power supply in a variety of manners, using a voltage supply such as a charge pump or others, and an input transistor connected between a supply port at which power is input to the primary power supply, and the internal power rail. The voltage supply is responsive to power provided to the primary power supply port at a first level for powering the internal power rail, by driving the input transistor in an ON state and drive the switching transistor in an OFF state. The voltage supply is further responsive to power provided to the supply port at a second level that is below a threshold power for the internal power rail, by driving the input transistor in an OFF state and drive the switching transistor in an ON state.

In some implementations, the switching transistor includes a channel connected to the internal power rail, and has a control terminal (e.g., gate) that is responsive to the voltage supply by operating in an OFF state in which current is prevented from flowing into the backup supply, and by operating in an ON state and connecting the backup power supply to the internal power rail when the voltage on the primary power supply drops below a predefined threshold voltage and/or a voltage level provided to the switching transistor by the backup power supply circuit.

In another embodiment involving the primary power supply above, a transistor has a source and drain connected between an input port and a node directly connected to both the internal power rail and the first source/drain region of the switching transistor, and operable to connect the input port to the node when the primary power supply is active. In certain implementations, a resistor and/or capacitor as described above may be implemented with the transistor, with the resistor discharging voltage from the gate of the transistor when power provided on the input port transitions toward 0V, and with the capacitor reducing the coupling of voltage fluctuations from the input port to the gate of the second transistor (e.g., as passed via a charge pump).

A more detailed embodiment involves an apparatus having an input power bus, an internal power rail (e.g., on-chip power), and two or more power supplies, with switching circuitry as noted above to implement connectivity of the power supplies. For instance, a switching circuit blocks current from flowing from a primary one of the power supplies to a secondary one of the power supplies, and selectively couples one of the secondary power supplies to the internal power rail when the primary power supply drops below a threshold and/or is removed. The switching circuit operates autonomously, based on the presence of power on the primary power supply via gate-controlled operation as discussed herein. A charge pump applies a voltage to the switching circuit, as follows. In response to power being provided on the input power supply, the charge pump operates a first transistor circuit to provide power to the internal power rail from the input power bus while the switching circuit prevents back current from flowing from the primary power supply to one or more of the secondary power supplies. In response to power on the primary power supply dropping below a threshold, the charge pump operates the first transistor circuit in a blocking state and operates a third transistor circuit in a passing state in which the third transistor circuit provides power from secondary power supply (or supplies) to the internal power rail. In some instances, two secondary power supplies are used, with one of the two supplies being a preferred supply and related circuitry for selecting between the supplies to provide power from the selected secondary supply to the switching circuit, and to block back current from passing between the secondary supplies (e.g., as in FIG. 6, with transistor 230 being enabled or disabled based on the presence of battery power). This additional power supply may, for example, be another battery supply (e.g., involving two secondary battery supplies), or a system power supply provided from one or more sources. Combinations of NMOS and PMOS switches may be used to facilitate desired ON and OFF states relative to a single charge pump voltage, in manners as disclosed above.

Various method-based embodiments may be carried out to implement approaches as discussed in connection with apparatuses as above, and in the following figures. For instance, aspects relating to power control, dissipation and mitigation of voltage spikes can be implemented in connection with the following embodiments described in FIGS. 1, 2, 4 and 6, and as may be implemented with the switch in FIG. 8.

Turning now to the figures, FIG. 1 shows an apparatus 100 operable for providing autonomous power supply coupling to an internal power rail 110, in accordance with another example embodiment. A switching circuit 120 operates with a primary power supply circuit 130 and a backup power supply circuit 140 (and optionally, one or more additional secondary backup power supply circuits 150), to power the internal power rail 110.

When power is present on the input port 132, the switching circuit 120 is responsive to a control input from the primary power supply circuit 130 by operating in an open or blocking state in which the backup power supply circuit 140 is not connected to the internal power rail. Further, the switching circuit 120 blocks current from flowing into the backup power supply circuit 140 from the primary power supply circuit 130. The control input in this regard may, for example, include a voltage provided to maintain a transistor in an open/blocking state. In this state, the primary power supply circuit 130 powers the internal power rail 110, using power provided at the input port 132.

When power at the input port 132 is removed or drops below a threshold level (e.g., a level that is lower than a voltage level provided by the backup power supply circuit 140), the switching circuit 120 is responsive to the control input form the primary power circuit 130 by operating in a passing state in which power is coupled from the backup power supply circuit to the internal power rail 110. In this state, the primary power circuit 130 may also block back current from flowing to the input port from the backup power supply circuit 140. The control input may, for example, involve a voltage level (or lack thereof, e.g., 0V), that is provided to operate the switching circuit 120 to couple the backup power supply circuit.

Figure 2:
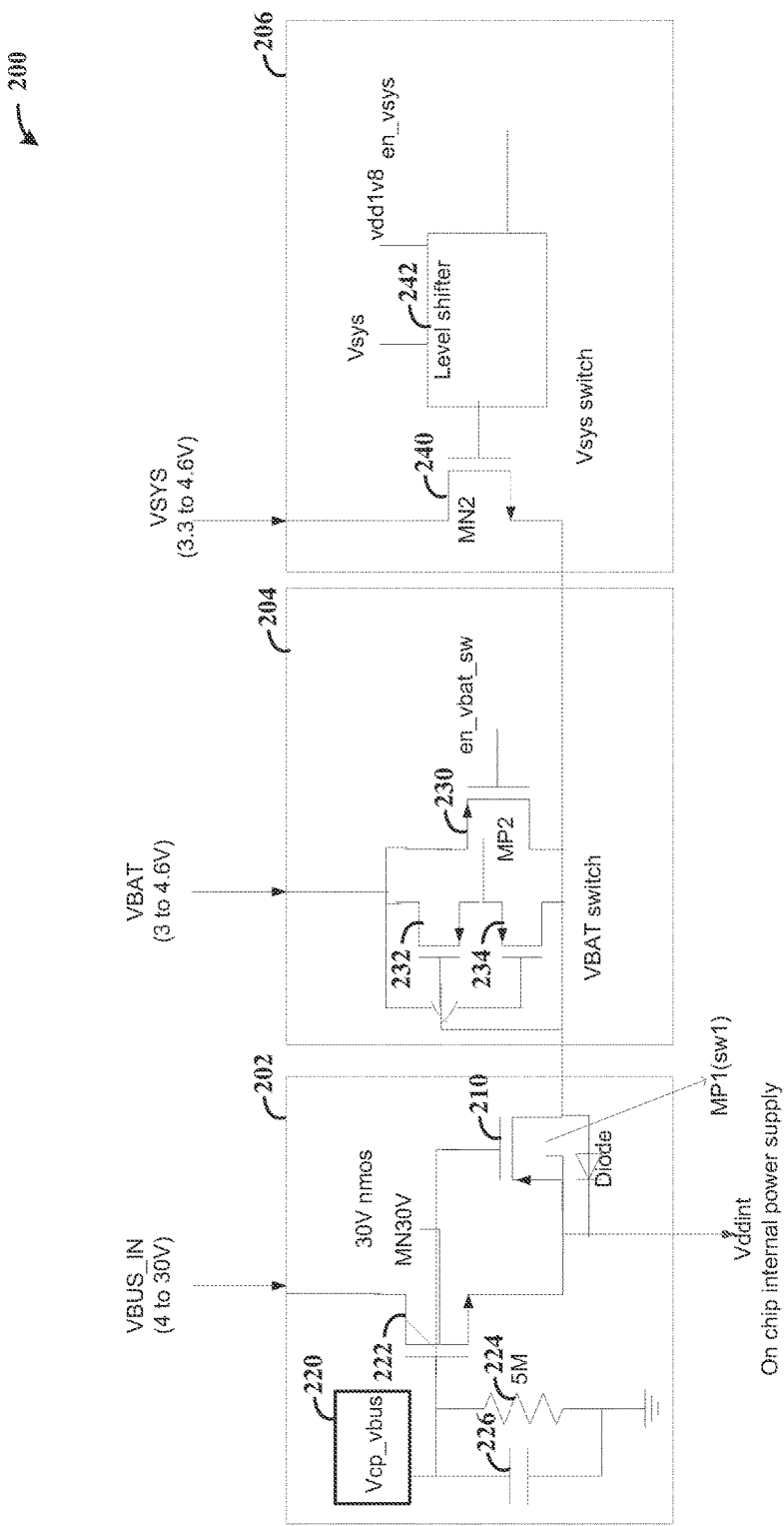
FIG. 2 shows an apparatus for providing autonomous power supply coupling, in accordance with another example embodiment.

FIG. 2 shows an apparatus 200 for providing autonomous power supply coupling for a main voltage VBUS_IN section 202, a batter backup VBAT section 204 and a system level voltage VSYS section 206 with respective exemplary operating voltage levels given, in accordance with another example embodiment. A switching circuit (transistor) 210 operates to selectively couple the battery input VBAT to an internal power supply Vddint, while also preventing back current from flowing into the VBAT section 204. The switch 210 is shown having a built-in diode that prevents the back current, with an n-well tied to Vddint.

Section 202 includes a charge pump 220 that generates a voltage output that drives the gates of transistors 222 and 210 (at the switching circuit). When power is provided on VBUS_IN, the charge pump 220 is active and operates the transistor 222 in a closed position and operates the transistor at 210 in the open position, such that VBUS_IN powers the internal power rail at Vddint.

When the voltage at VBUS_IN is removed or drops below a threshold, the charge pump 220 ceases to provide the voltage to the gates of transistors 222 and 210, which switches transistor 222 off and switches transistor 210 on. Transistor 210 thus is responsive by coupling the internal power rail at Vddint to section 204. Resistor 224 operates to pull voltage off of the gate of transistor 222 when the charge pump 220 shuts off, to mitigate the coupling of any back current into section 204 while backup or system power is provided to Vddint. Capacitor 226 operates to diminish fluctuation/peaks of voltages applied to the gate of transistor 222. Transistor 222 may be implemented as an NMOS transistor with transistor 210 as a PMOS transistor, to facilitate the on and off states above, relative to the charge pump 220 (e.g., transistor 210 turns on when its gate voltage is 0V and the source/drain voltage is greater than 0.7V). When section 204 is coupled by switch 210, switches 230, 232 and 234 control the coupling of VBAT, and switch 240 along with level shifter 242 controls the coupling of backup power supply VSYS.

Figure 3:
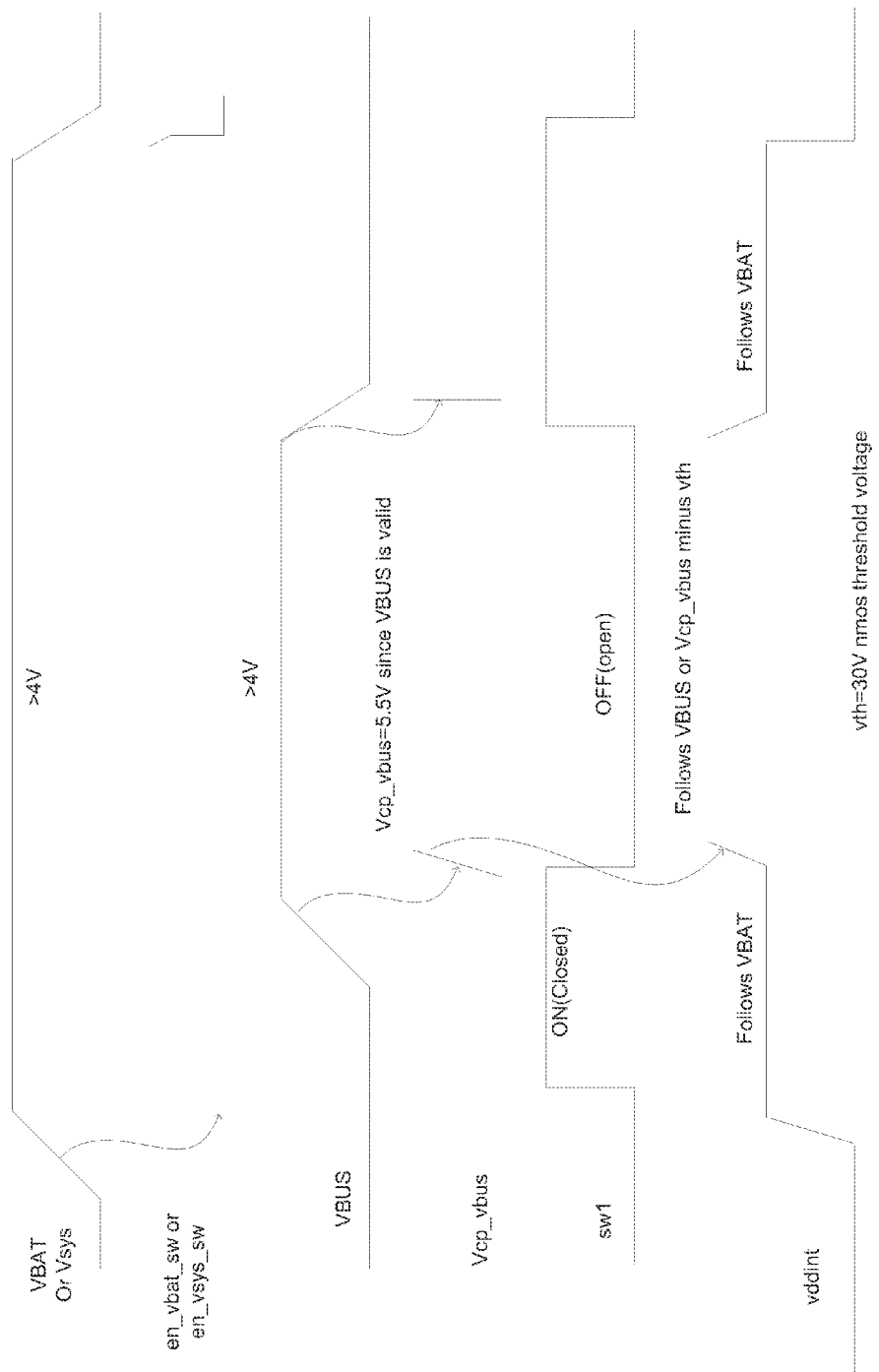
FIG. 3 shows a timing diagram for providing autonomous power supply coupling, in accordance with another example embodiment.

FIG. 3 shows a timing diagram for providing autonomous power supply coupling, in accordance with another example embodiment. The approaches shown in FIG. 3 may, for example, be implemented with the apparatus 200 in FIG. 2, and are discussed accordingly by way of example. When VBUS is in a voltage range set as a valid range, then the charge pump voltage Vcp_vbus=5.4V and an input high voltage (e.g., 30V) NMOS transistor (222) is enabled and MP1 (210) is disabled due to 5.4V applied to its gate. When VBAT is in a valid voltage range, a VBAT switch is enabled autonomously and, with MP1 disabled, Vddint is powered from VBUS. When VBUS is not powered, the charge pump voltage Vcp_vbus=0V, disabling the high voltage NMOS transistor (222) and enabling MP1 (210), powering Vddint from VBAT. When Vsys (e.g., ID_CON) is in a valid voltage range, then a Vsys switch (240) is enabled autonomously. In some implementation, a series switch is implemented between VBAT and Vsys power supplies, where voltage ranges are different. If power is removed or ceases for VBAT and Vsys, Vddint defaults back to VBUS. In such contexts, VBUS may be implemented in a voltage range of 4 to 5.5V and a maximum voltage of 28V, with VBAT implemented in a voltage range of 3 to 4.6V with a maximum of 6V, and with Vsys in a range of 3 to 4.6V with a maximum of 6V.

Figure 4:
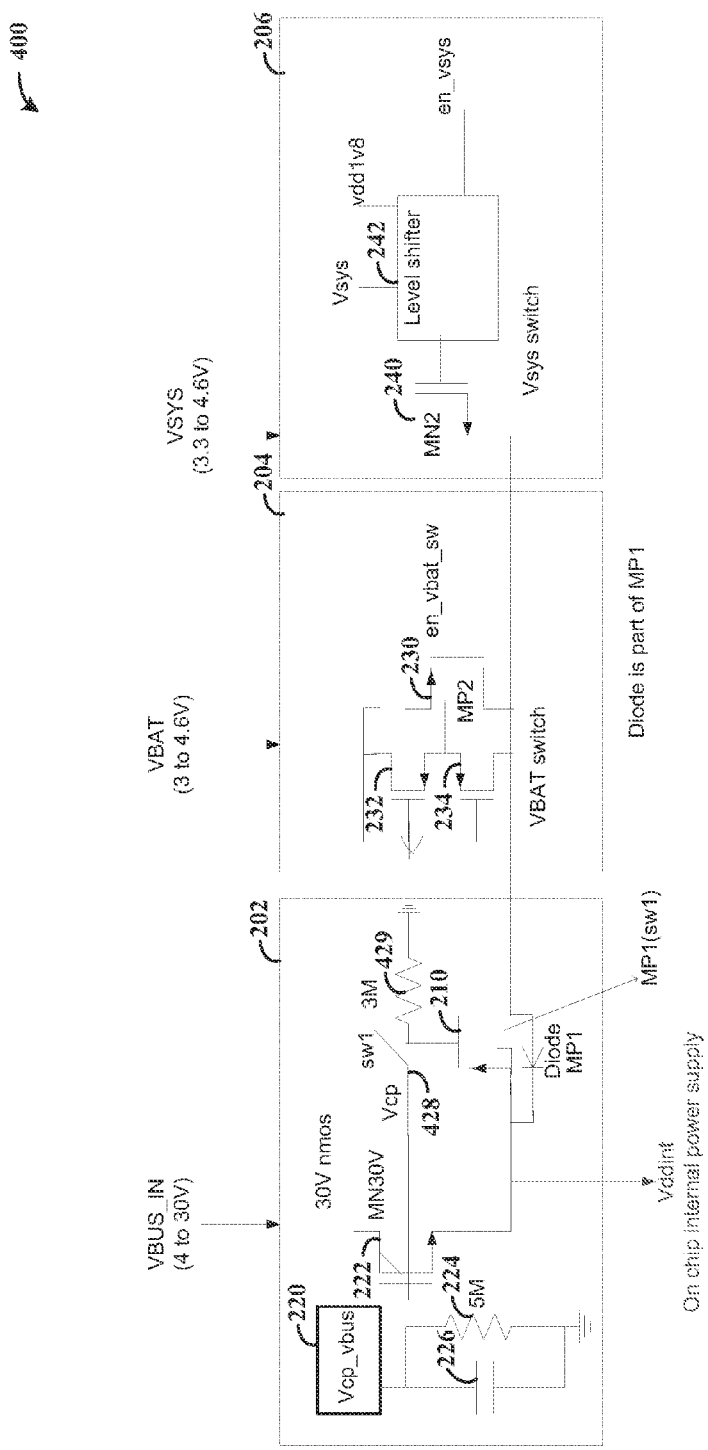
FIG. 4 shows an apparatus for providing autonomous power supply coupling, in accordance with another example embodiment.

FIG. 4 shows an apparatus 400 for providing autonomous power supply coupling, in accordance with another example embodiment in which a battery supply voltage is set as a primary/main voltage supply. The apparatus 400 is similar to apparatus 200 in FIG. 2, with similar components labeled with similar numbers. The apparatus 400 also includes a switch 428 and resistor circuit 429 that operates to set a threshold voltage at which the switching circuit 210 operates. In one implementation, the switch 428 and resistor circuit 429 operate to set such a threshold with the switch being closed when VBAT is greater than 2.8V, and open when VBAT is less than 2.8V. Accordingly, when VBUS is greater or equal than 4V and VBAT is less than 2.8V, the charge pump voltage Vcp_vbus is 5.5V. When VBUS is greater or equal than 4V and VBAT is greater than 2.8V, the charge pump voltage Vcp_vbus is 3.0V. When VBUS is less than 4V, the charge pump voltage Vcp is 0V, setting the threshold (4V) below which power supply is switched over from VBUS to one of backup supplies VBAT and Vsys.

Figure 5:
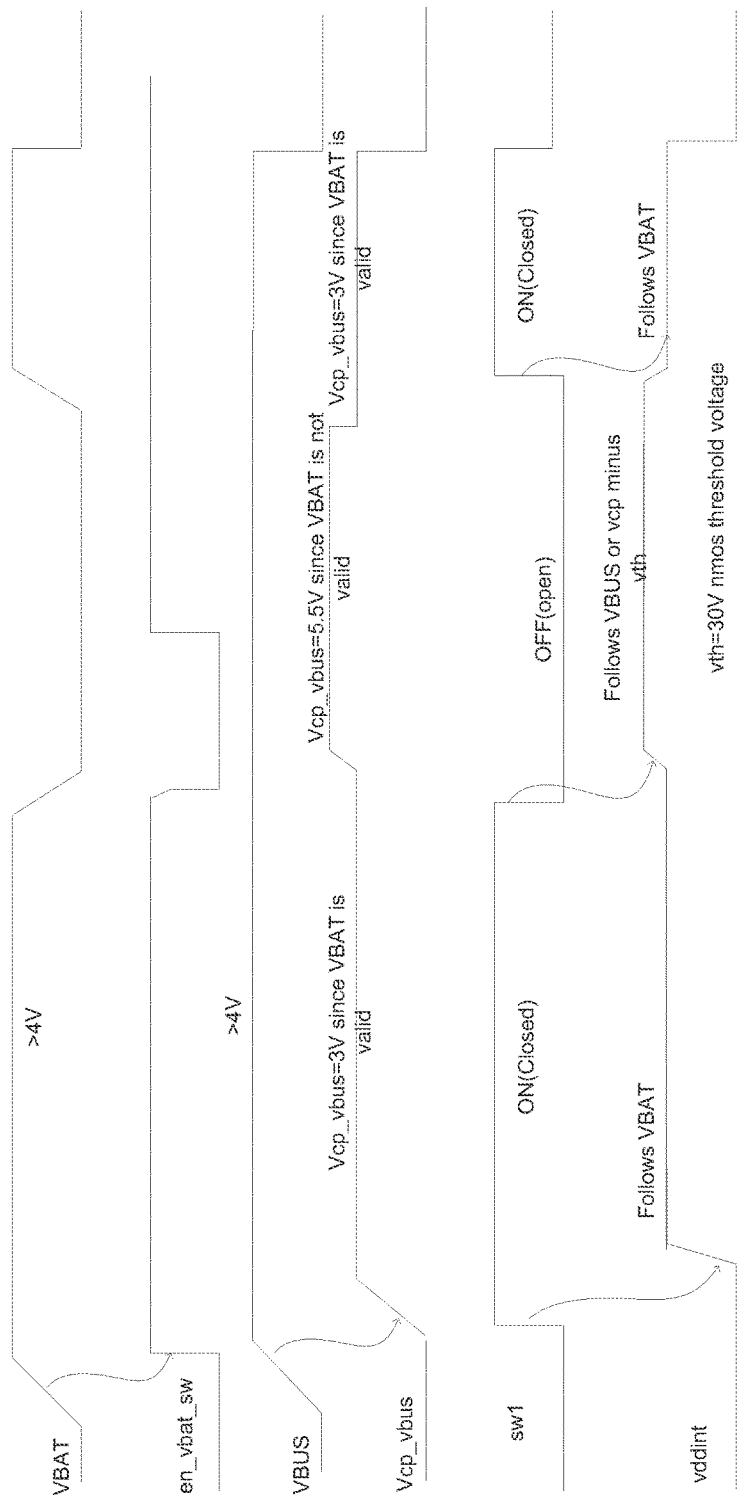
FIG. 5 shows a timing diagram for providing autonomous power supply coupling, in accordance with another example embodiment.

In some implementations, a VBAT FIG. 5 shows a timing diagram for providing autonomous power supply coupling, in accordance with another example embodiment. The approach shown in FIG. 5 may, for example, be implemented with the apparatus 400 in FIG. 4 (and is described accordingly). A status detector in the VBUS supply domain is used to enable or disable the switch 428. When the VBAT status detector is valid, the charge pump voltage is lowered so that Vddint is powered from VBAT and there is no back current from VBAT to VBUS, since the gate of the transistor 222 is <VBAT. When the VBAT power goes away, then Vddint switches to VBUS.

Figure 6:
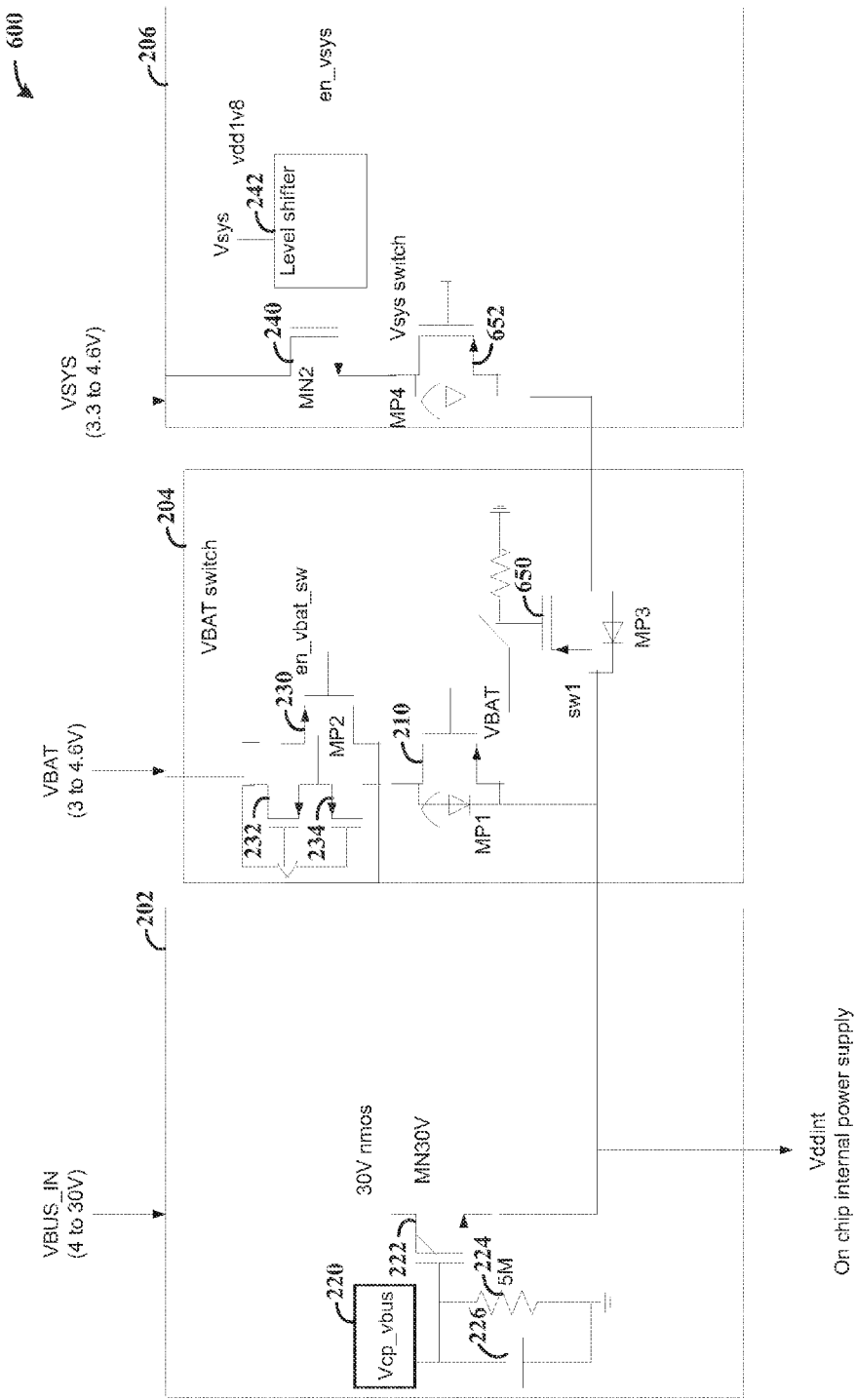
FIG. 6 shows an apparatus for providing autonomous power supply coupling, in accordance with another example embodiment.

FIG. 6 shows an apparatus 600 for providing autonomous power supply coupling, in accordance with another example embodiment, which can be used to set a priority secondary power supply (VBAT) while VBUS is a primary/main supply. The apparatus 600 may be implemented in a manner similar to the apparatus 200 shown in FIG. 2, with similar components being labeled commonly. The apparatus 600 also includes switch components 650 and 652, with switch 650 controlled by VBAT for selecting between VBAT and VSYS, and with switch 652 controlled by charge pump 220. In some implementations, the gate of the shown transistor in switch 650 is tied to 2VBAT to set VBAT as a priority power supply relative to Vsys, and is in a valid voltage range. The gate of switch 240 is tied to 2Vsys when Vsys is a priority power supply and is in valid voltage range.

Figure 7:
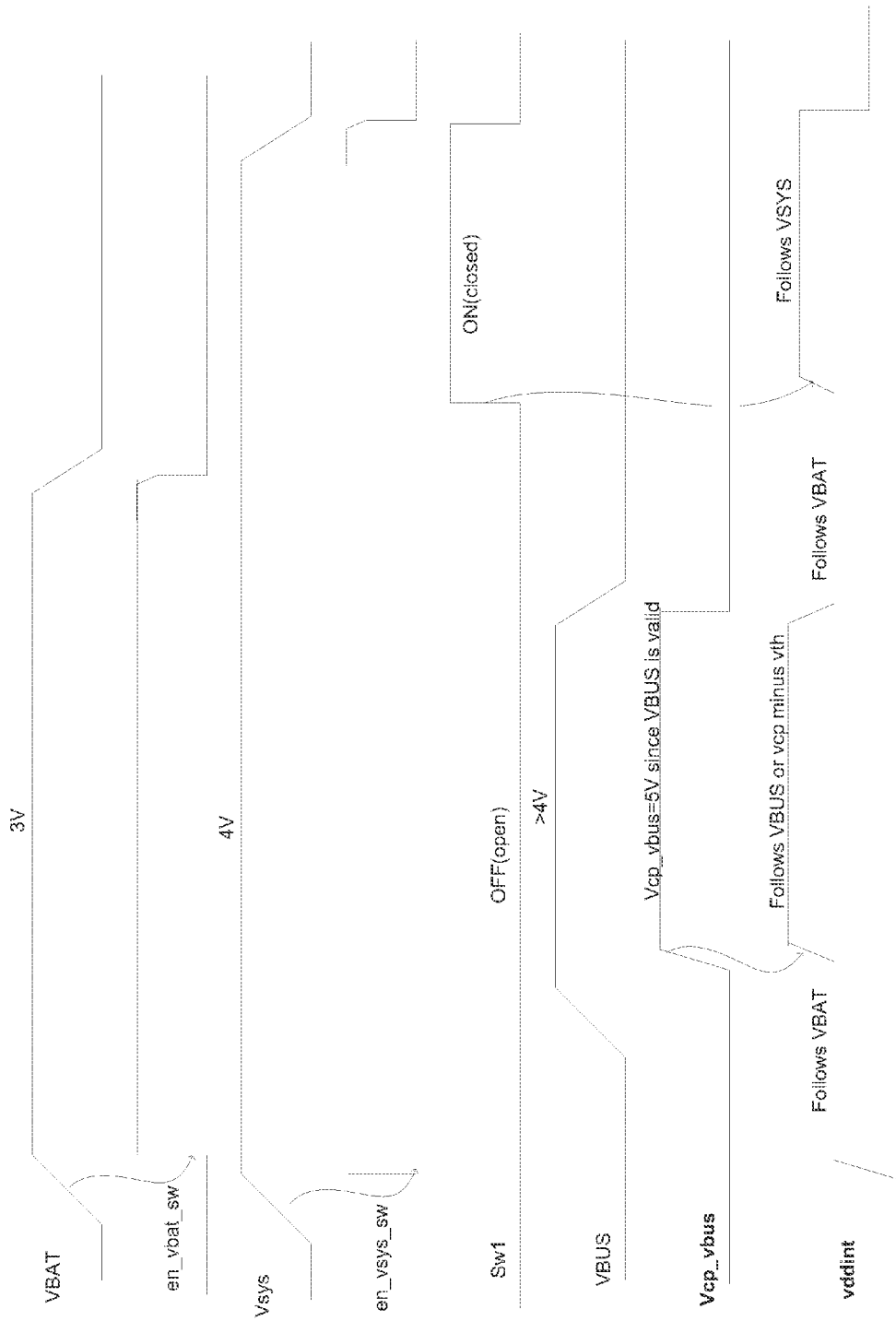
FIG. 7 shows a timing diagram for providing autonomous power supply coupling, in accordance with another example embodiment.

FIG. 7 shows a timing diagram for providing autonomous power supply coupling, in accordance with another example embodiment. The approach shown in FIG. 7 may, for example, be implemented with the apparatus 600 in FIG. 6 (and is described accordingly). When VBAT is less than 2.8V, switch 650 is closed. When VBAT is greater than 2.8V, switch 650 is open. Switches 210, 230, 650 and 652 are PMOS transistors and turn on when their gates are at 0V, with internal diodes. When VBUS is greater or equal than 4V, the charge pump voltage Vcp_vbus is 5.4V. When VBUS is less than 4V, the charge pump voltage Vcp_vbus is 0V.

Figure 8:
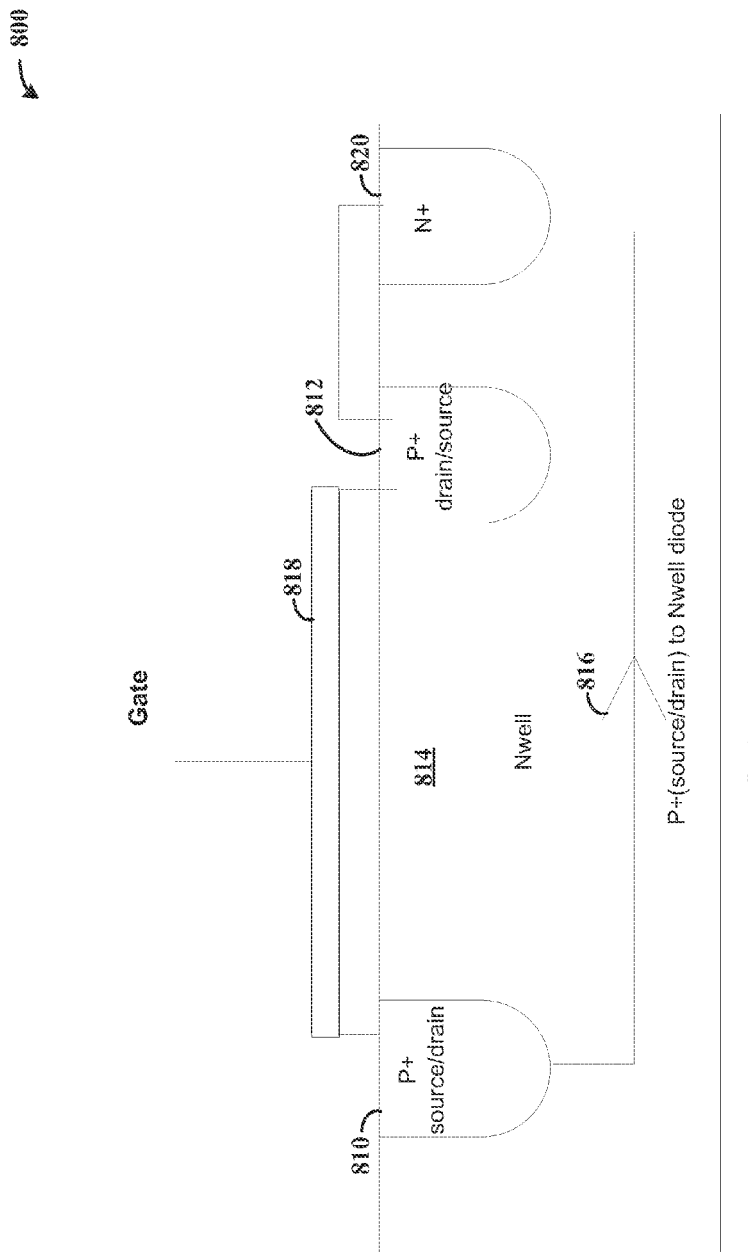
FIG. 8 shows a switching circuit, in accordance with another example embodiment.

FIG. 8 shows a switching circuit 800 in cross-section, in accordance with another example embodiment. The switching circuit 800 may, for example, be implemented with circuit 210 of FIG. 2. Source/drain regions 810 and 812 are separated by a channel region 814 in a PMOS arrangement, with an n-well thereof optionally coupled to an internal power rail. A built-in diode 816 is also shown representatively and with the source/drain region 810 coupled to N+ region 820. A gate/control port 818 controls conductivity of the channel region 814.

Various blocks, modules or other circuits may be implemented to carry out one or more of the operations and activities described herein and/or shown in the figures. In these contexts, a "block" (also sometimes "logic circuitry" or "module") is a circuit that carries out one or more of these or related operations/activities (e.g., switching or controlling). For example, in certain of the above-discussed embodiments, one or more modules are discrete logic circuits or programmable logic circuits configured and arranged for implementing these operations/activities, as in the circuit modules shown in FIG. 1. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., non-volatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, different circuits may be implemented for those shown in the drawings, to achieve a similar function. Other power supplies may be preferred or otherwise given a priority over other power supplies. In addition, the various embodiments described herein may be combined in certain embodiments, and various aspects of individual embodiments may be implemented as separate embodiments. Such modifications do not depart from the true spirit and scope of various aspects of the invention, including aspects set forth in the claims.

What is claimed is:

1. An apparatus comprising:
an internal power rail configured and arranged to provide power to circuits in the apparatus;
a switching circuit including a switching transistor having a first source/drain region connected to a primary power supply circuit and to the internal power rail, having a second source/drain region connected to a backup power supply circuit, and having a control terminal coupled to the primary power supply circuit, the switching transistor being configured and arranged with the primary power supply circuit and with the backup power supply circuit to
respond to power provided via the primary power supply circuit, by automatically switching to a blocking state in which back current is prevented from flowing from the primary power supply circuit to the backup power supply circuit while the primary power supply circuit couples power to the internal power rail, and
respond to a voltage coupled to the control terminal via the primary power supply circuit and to a voltage on the primary power supply being smaller than a voltage on the backup power supply circuit, by automatically switching to another state in which the internal power rail is connected for providing power from the backup power supply circuit to the internal power rail; and
another circuit configured and arranged to use power provided by the primary power supply circuit to operate the switching transistor in an OFF state by applying the voltage to the control terminal in the blocking state wherein the other circuit is configured and arranged to cease applying the voltage to the control terminal in response to power dropping on the primary power supply circuit, and wherein the switching transistor is configured and arranged to automatically switch to an ON state in response to the other circuit ceasing to apply the voltage.

2. The apparatus of claim 1, wherein the other circuit is a charge pump circuit.

3. The apparatus of claim 2, wherein
the primary power supply circuit includes an input port at which power is provided to the primary power supply circuit and a second transistor having a gate coupled to an output voltage of the charge pump and a source and drain connected between the input port and a node directly connected to both the internal power rail and the first source/drain region of the switching transistor, and
the charge pump is configured and arranged to couple power from the input port to the internal power rail by using the power provided by the primary power supply circuit to operate the second transistor in an ON state while operating the switching transistor in the OFF state.

4. The apparatus of claim 3, wherein
the switching transistor is a PMOS transistor configured and arranged to operate in the OFF state in response to a voltage level provided to a gate of the PMOS transistor by the charge pump and to operate in the ON state in response to the charge pump ceasing to provide the voltage level to the gate of the PMOS transistor, and
the second transistor is an NMOS transistor configured and arranged to operate in the ON state in response to a voltage level provided to a gate of the NMOS transistor by the charge pump and to operate in the OFF state in response to the charge pump ceasing to provide the voltage level to the gate of the NMOS transistor.

5. The apparatus of claim 4, wherein the primary power supply circuit further includes a resistor circuit coupled to the second transistor and to the charge pump, and configured and arranged to mitigate back current flow from the internal power rail to the input port by discharging voltage from the gate of the second transistor in response to power provided on the input port transitioning toward 0V.

6. The apparatus of claim 5, wherein the primary power supply circuit further includes a capacitor circuit coupled to the second transistor and to the charge pump in parallel with the resistor circuit, and configured and arranged to reduce the coupling of voltage fluctuations from the input port to the gate of the second transistor.

7. The apparatus of claim 4, wherein the primary power supply circuit further includes a capacitor circuit coupled to the second transistor and to the charge pump, and configured and arranged to reduce the coupling of voltage fluctuations from the input port to the gate of the second transistor.

8. The apparatus of claim 1, wherein the primary power supply circuit includes an input transistor connected between a primary power supply port and the internal power rail, further including a voltage supply connected to respective control terminals of the transistors, the voltage supply being configured and arranged to
  in response to power provided to the primary power supply port at a first level for powering the internal power rail, drive the input transistor in an ON state and drive the switching transistor in an OFF state, and
  in response to power provided to the primary power supply port at a second level that is below a threshold power for the internal power rail, drive the input transistor in an OFF state and drive the switching transistor in an ON state.

9. The apparatus of claim 1,
  further including a voltage supply connected to the control terminal of the switching transistor and powered via the primary power supply circuit, and
  wherein the switching transistor includes a channel connected to the internal power rail, and the control terminal of the switching transistor is responsive to the voltage supply by operating in an OFF state in which the back current is prevented from flowing in response to the voltage supply being powered, and by operating in an ON state and connecting the backup power supply circuit to the internal power rail when the voltage on the primary power supply circuit drops below a predefined threshold voltage.

10. The apparatus of claim 1,
  further including a voltage supply connected to the control terminal of the switching transistor and powered via the primary power supply circuit,
  wherein the switching transistor includes a channel connected to the internal power rail, and the control terminal of the switching transistor is responsive to the voltage supply by operating in an OFF state in which the back current is prevented from flowing in response to the voltage supply being powered, and by operating in an ON state and connecting the backup power supply circuit to the internal power rail when the voltage on the primary power supply circuit drops below a voltage level provided to the switching transistor by the backup power supply circuit.

11. The apparatus of claim 1, wherein the switching transistor is a P channel transistor configured and arranged to operate in an OFF state in response to a gate voltage provided by a power supply, and to transition to an ON state in response to the power supply ceasing to provide the gate voltage.

12. The apparatus of claim 1, wherein the primary power supply circuit further includes
  a second transistor having a source and drain connected between an input port and a node directly connected to both the internal power rail and the first source/drain region of the switching transistor
  a resistor circuit coupled to a gate of the second transistor and configured and arranged to mitigate back current flow from the internal power rail to the input port by discharging voltage from the gate of the second transistor in response to power provided on the input port transitioning toward 0V, and
  a capacitor circuit coupled to the gate of the second transistor in parallel with the resistor circuit, and configured and arranged to reduce the coupling of voltage fluctuations from the input port to the gate of the second transistor.

13. The apparatus of claim 1, wherein the switching circuit includes a diode circuit configured and arranged to block current from flowing from the primary power supply circuit to the backup power supply circuit.

14. An apparatus comprising:
  an input power bus configured and arranged to provide input power from an external power supply;
  an internal power rail configured and arranged to provide power to circuits coupled thereto;
  an external power supply circuit including a first input port connected to the input power bus and a first transistor circuit having a first gate, the first transistor circuit being configured and arranged to selectively couple power from the first input port to the internal power rail based on a voltage applied to the first gate;
  a battery power supply circuit including a second input port and a second transistor circuit having a second gate, the second transistor circuit being configured and arranged to couple power from a battery coupled to the second input port based on a voltage applied to the second gate;
  a switching circuit including
    a diode configured and arranged to block current from flowing from the external power supply circuit to the battery power supply circuit, and
    a third transistor circuit having a third gate and respective source/drain regions, a first one of the source/drain regions being connected to the internal power rail, and a second one of the source/drain regions being connected to the second transistor circuit, the third transistor circuit being configured and arranged to couple power from the battery to the internal power rail, via the second transistor, based on a voltage applied to the third gate; and
  a charge pump configured and arranged to apply a voltage respectively to the first and third gates using power provided on the input power bus, and being configured and arranged with the first and third transistor circuits to selectively power the internal power rail with the input power bus and the battery by
    in response to power being provided on the input power bus, operating the first transistor circuit in a passing state and operating the third transistor circuit in a blocking state, in which the first transistor provides power to the internal power rail form the input power bus while the diode prevents back current from flowing from the input power bus to the battery power supply circuit, and
    in response to power on the input power bus dropping below a threshold, operating the first transistor circuit in a blocking state and operating the third transistor circuit in a passing state in which the third transistor circuit provides power from the battery, via the second transistor circuit, to the internal power rail.

15. The apparatus of claim 14, wherein
  the first transistor circuit is an NMOS circuit configured and arranged to couple the power from the first input port to the internal power rail in response to the charge pump applying a gate threshold voltage to the first gate, and to block power from passing between the first input port and the internal power rail in response to the charge pump ceasing to apply the gate threshold voltage to the first gate; and the third transistor circuit is a PMOS circuit configured and arranged to block power from passing from the battery to the internal power rail in response to the charge pump applying the gate threshold voltage to the third gate, and to couple power from the battery to the internal power rail in response to the charge pump ceasing to apply the gate threshold voltage to the third gate.

16. The apparatus of claim 14, further including:
a third power supply circuit having a fourth transistor circuit having a fourth gate and respective source/drain regions coupled between a third power source and the internal power rail, the fourth transistor circuit being configured and arranged to couple power from the third power source to the internal power rail based on a voltage applied to the fourth gate; and
a fifth transistor between the second input port and the second transistor, the fifth transistor having a gate coupled to the second input port and configured and arranged to operate in an ON state and therein to pass power from the second input port to the second transistor, and to operate in an OFF state in response to voltage on the second input port falling below a battery threshold,
wherein the switching circuit is configured and arranged to, in response to the power on the input power bus dropping below the threshold, couple power from the battery to the internal power rail when the fifth transistor is in the ON state, and couple power from the third power supply circuit to the internal power rail when the fifth transistor is in the OFF state.

17. A method for use with an internal power rail that provides power to circuits in an apparatus, the method comprising:
using a switching circuit including a switching transistor having a first source/drain region connected to a primary power supply circuit and to the internal power rail, having a second source/drain region connected to a backup power supply circuit, and having a control terminal coupled to the primary power supply circuit, by
in response to power provided via the primary power supply circuit, automatically switching to a blocking state in which back current is prevented from flowing from the primary power supply circuit to the backup power supply circuit while the primary power supply circuit couples power to the internal power rail,
in response to a voltage coupled to the control terminal via the primary power supply circuit and to a voltage on the primary power supply being smaller than a voltage on the backup power supply circuit, automatically switching to another state in which the internal power rail is connected for providing power from the backup power supply circuit to the internal power rail; and
using power provided by the primary power supply circuit to operate the switching transistor in an OFF state by another circuit applying the voltage to the control terminal in the blocking state, wherein the other circuit ceases applying the voltage to the control terminal in response to power dropping on the primary power supply circuit, and the switching transistor automatically switches to an ON state in response to the other circuit ceasing to apply the voltage.

18. The method of claim 17, further including
mitigating back current flow from the internal power rail to the primary power supply circuit by discharging voltage from a control terminal of a second transistor that couples power from an input port to the internal power rail, in response to power provided on the input port transitioning toward 0V, and
reducing coupling of voltage fluctuations from the input port to a gate of the second transistor.

* * * * *